United States Patent [19]

Yang et al.

[11] Patent Number: 5,762,777
[45] Date of Patent: Jun. 9, 1998

[54] PROCESS OF DIRECTLY ELECTROPLATING ONTO A NONCONDUCTIVE SUBSTRATE

[75] Inventors: Ching-hsiung Yang, Hsinchu; Chi-chao Wan, Taipei; Yung-yun Wang, Taipei; Chung-chieh Chen, Taipei, all of Taiwan

[73] Assignee: Persee Chemical Co. Ltd., Tuchering, Taiwan

[21] Appl. No.: 643,232

[22] Filed: May 2, 1996

[51] Int. Cl.⁶ .............................. C25D 5/54; C25D 5/56; C25D 5/02; C25D 5/34
[52] U.S. Cl. .................. 205/158; 205/159; 205/164; 205/210; 205/125
[58] Field of Search .................... 205/125, 158, 205/159, 164, 210

[56] References Cited

U.S. PATENT DOCUMENTS

| | | | |
|---|---|---|---|
| 4,895,739 | 1/1990 | Bladon | 205/159 |
| 4,969,979 | 11/1990 | Appelt et al. | 205/210 |
| 5,374,346 | 12/1994 | Bladon et al. | 205/159 |

*Primary Examiner*—Kathryn L. Gorgos
*Assistant Examiner*—Edna Wong
*Attorney, Agent, or Firm*—Kirkpatrick & Lockhart LLP

[57] ABSTRACT

A process of directly plating onto a nonconductive substrate is disclosed. The process comprises the steps of:

1) conditioning: modifying a surface of the nonconductive substrate with selected organic hydrocarbons or polymers to enhance its property of adsorbing catalysts;

2) catalyzing: immersing the conditioned substrate into a catalyst colloid-containing solution or a catalyst complex-containing solution to let the catalyst be adsorbed onto the substrate;

3) accelerating: reducing the catalyst with a suitable acid or basic solution (adapted to the catalyst colloid), or with a reducing agent (adapted to the catalyst complex) to reduce the catalyst being adsorbed onto the substrate;

4) enhancing: immersing the substrate after accelerating step into an enhancing agent containing a compound with two ligands;

5) electroplating: proceeding with a plating process.

15 Claims, No Drawings

PROCESS OF DIRECTLY ELECTROPLATING ONTO A NONCONDUCTIVE SUBSTRATE

The present invention relates to a process of direct electroplating onto a nonconductive substrate. Particularly, the present invention relates to a process of electroplating directly copper onto the surface of a nonconductive substrate, e.g., a printed circuit board.

DESCRIPTION OF THE PRIOR ART

The techniques of electroplating on the surface of a nonconductive substrate have been focused recently, especially in the field of printed circuit board. Nonconductor surfaces are conventionally metallized by a sequence of steps comprising of:

1) conditioning: modifying a surface of the nonconductive substrate with selected organic hydrocarbons or polymers to enhance its property of adsorbing catalysts;
2) catalyzing: immersing the conditioned substrate into a catalyst colloid-containing solution or a catalyst complex-containing solution to let the catalyst be adsorbed onto the substrate;
3) accelerating: reducing the catalyst with a suitable acid or basic solution (adapted to the catalyst colloid), or with a reducing agent (adapted to the catalyst complex) to reduce the catalyst adsorbed onto the substrate;
4) chemically reducing or electroless depositing: reducing metal ions contained in a solution with a reducing agent, so as to deposit a metal onto the surface of catalyst.

After the treatment of steps 1) through 4), there is a layer of metal formed on the surface of the nonconductive substrate, and its conductivity is sufficient to proceed with the subsequent electroplating procedure, or other necessary treating procedures.

The main drawbacks of the above process are caused by the instability of chemically reducing process per se, the poor quality of electroplating layer, the high cost of operating and the pollution to the environment caused by the used reducing agents (such as formaldehyde, diamine and hypophosphorous acid, especially formaldehyde).

Focusing on the above drawbacks, there are several improved processes which have been disclosed:

a) Utilizing graphite colloid instead of above steps 2 to 4; for example, those disclosed in U.S. Pat. Nos. 5,183,552; 4,622,108. However, due to the viscosity of graphite colloid, the electroplated layer is unstable; thus, this improved process can only be used in low-level products. This restriction limits its industrial applications.

b) Utilizing conductive polymer instead of above steps 1 to 4; for example, those disclosed in U.S. Pat. No. 5,183,552. However, the conductive polymer per se is unstable and costly.

c) Enhancing the concentration of the catalyst so as to thicken the catalyst deposition and to omit the subsequent steps 3 and 4. However, this improvement is costly, and exhibits the defect of incomplete coating.

d) Utilizing a sodium sulfide solution instead of the chemical reduction of above step 4, for example, those disclosed in U.S. Pat. Nos. 5,376,248; 5,238,550; 5,207,888; 5,075,739; 5,007,990; 4,952,286; 4,929,768. However, this improvement still has the following defects:

d.1. The binding strength between sulfur ion and metal is very strong, which will induce the formation of copper sulfide on the surface of copper foil presented on the substrate. The formed copper sulfide will hinder the subsequent electroplating procedure.

d.2. The crystallinity of the surface treated with sodium sulfide is weaker than the electroplated layer per se; thus, it is easy to induce structural defects at the interface between the surface treated with sodium sulfide and the electroplating layer.

d.3. In some cases, the holes per se on the substrate (printed circuit board) are only necessary to be defined there through, and do not need to possess a conductive characteristic. However, after the treatment of sodium sulfide solution, all the parts contacted with the sodium sulfide solution will be coated with metal, which would induce additional difficulty.

The main purpose of the above mentioned four improved processes is to eliminate the chemical reduction of step 4 to deposit copper or nickel on the surface of nonconductive substrate. Their common motive is to provide alternative process to enhance the surface conductivity of the substrate so as to facilitate the subsequent electroplating procedure without a chemically deposited metal films. However, in fact, the Inventors find that the procedure of utilizing sodium sulfide solution process actually cannot increase the surface conductivity. After detailed study, we have found its major function is to capture metal ions by the two ligands of sulfur ions; thus, this characteristic will expedite the direct electroplating effect on the surface of a nonconductive substrate. Based on the principle, the Inventors modify the improved process d, and find that there are many other compounds with two ligands possessing preferred effect in the field of directly electroplating.

SUMMARY OF THE INVENTION

The object of the present invention is to provide a process of electroplating directly onto a nonconductive substrate.

Another object of the present invention is to provide a process of direct electroplating of copper, tin, lead or silver onto the surface of a nonconductive substrate, especially, printed circuit boards. The process is of lower cost and less of a pollutant to the environment than the prior arts.

Yet another object of the present invention is to provide a process of electroplating directly onto a nonconductive substrate, comprising the steps of:

1) conditioning: modifying a surface of the nonconductive substrate with selected organic hydrocarbons or polymers to enhance its property of adsorbing catalysts;
2) catalyzing: immersing the conditioned substrate into a catalyst colloid-containing solution or a catalyst complex-containing solution to let the catalyst be adsorbed onto the substrate;
3) accelerating: reducing the catalyst with a suitable acid or basic solution (adapted to the catalyst colloid), or with a reducing agent (adapted to the catalyst complex) to reduce the catalyst being adsorbed onto the substrate;
4) enhancing: immersing the substrate after accelerating step into an enhancing agent containing a compound with two ligands;
5) electroplating: proceeding with an electroplating process.

DESCRIPTION OF THE PREFERRED EMBODIMENTS

The present invention is suitable for manufacture of a variety of commercial articles where a metal deposit is desired over the surface of a nonconductive substrate. Especially, the present invention is suitable for the production of printed circuit boards. For this reason, the description that follows is directed primarily to printed circuit board manufacture. Thus, the used nonconductive substrate is selected from the group comprising FR-4™, FR-5™, CEM-3™, polyamide, plastics, PE, and Teflon™ (polytetrafluroethylene). FR-4™ and FR-5™ are abbreviations of flame resistant laminates. FR-4™ is based on glass-fiber fabrics, and FR-5™ is based on epoxy resin. CEM-3™ is a composite epoxy material.

As mentioned before, the present invention relates to a process of directly electroplating onto a nonconducive substrate, comprising the steps of:

1) conditioning: modifying a surface of the nonconductive substrate with selected organic hydrocarbons or polymers to enhance its property of adsorbing catalysts;

2) catalyzing: immersing the conditioned substrate into a catalyst colloid-containing solution or a catalyst complex-containing solution to let the catalyst be adsorbed onto the substrate;

3) accelerating: reducing the catalyst with a suitable acid or basic solution (adapted to the catalyst colloid), or with a reducing agent (adapted to the catalyst complex) to reduce the catalyst being adsorbed onto the substrate;

4) enhancing: immersing the substrate after the accelerating step into an enhancing agent containing a compound with two ligands.

5) electroplating: proceeding with an electroplating process.

1) Conditioning

The object of this step is to modify the surface property of a nonconductive substrate so as to enhance the adsorbing property of the nonconductive substrate to catalysts. The procedure of this step is well known for those who are skilled in the art. Usually, the nonconductive substrate is immersed in selected organic hydrocarbon or polymer solution for a suitable time (depending on the properties of the nonconductive substrates). The used organic hydrocarbons usually contain 16 to 20 carbon atoms, such as PTH-102™ (produced by PERSEE CHEMICAL CO., LTD.) and PTH-233™ (produced by SHIPLEY CHEMICAL CO., LTD.).

2) Catalyzing

The procedure of adsorbing catalyst onto the nonconductive substrate is also well known to those who are skilled in the art. The nonconductive substrate after conditioning is immersed into a catalyst colloid-containing solution or a catalyst complex-containing solution to let the catalyst be adsorbed onto the surface of the nonconductive substrate. The catalyst colloid-containing solution or catalyst complex-containing solution is well known, such as disclosed in "The Chemistry of Colloids", by Zsgmondy, John Wiley and Sons, Inc. New York, 1917, Chapter 8, pp 176 to 178. Usually, the catalyst colloid or catalyst complex is a catalytic metal chalcogenide. The metals which can be used as catalyst in the present invention are platinum, gold, palladium, nickel and copper. Palladium is most preferred. Copper and nickel are least preferred especially as it is difficult to form stable chalcogenide colloids or complexes of catalyst with either of them. The term chalcogenide means a sulfide, telluride or selenide of the catalytic metal. The preferred chalcogenide is sulfide. Thus, the preferred colloidal (or complex) catalytic metal chalcogenide is a colloid (or complex) of palladium sulfide. The treatment conditions for immersion of a part to be electroplated in the catalyst colloid-containing solution or in a catalyst complex-containing solution are not critical. Preferably, treatment times vary from about 30 seconds to about 15 minutes, and more preferably, vary from about 2 to about 6 minutes. The temperature may vary from room temperature to near the boiling point of the solution. Preferably, the treatment temperature varies from about 45° C. to about 55° C.

3) Accelerating

The object of accelerating is to metallize the catalyst. Usually, a basic solution is employed if a catalyst colloid is used, and a reducing agent is employed if a catalyst complex is used. The basic solution is selected from the group comprising ammonium hydroxide ($NH_4OH$), sodium hydroxide (NaOH), potassium hydroxide (KOH), sodium carbonate ($Na_2CO_3$), sodium hydrogen carbonate ($NaHCO_3$) and magnesium carbonate ($MgCO_3$). The acid solution is selected from the group comprising hydofluoric acid (HF), fluoboric acid ($HBF_4$), sulfuric acid ($H_2SO_4$) and hydrochloric acid (HCl). The used reducing agent is selected from the group comprising sodium borohydride($NaBH_4$), dimethyl boron hydride, hydrazine, HCHO and phosphoric acid ($H_3PO_3$). The treatment conditions of accelerating are not critical to the present invention. Preferably, the concentration of basic, acid solutions or reducing agent is preferable between about 0.1 g/l and 120 g/l, and the treatment temperature of accelerating employed is between about 20° C. and 70° C. The treatment time of this step is between about 20 seconds and about 10 minutes.

4) Enhancing

The object of this step is to provide a linkage between the copper ions and catalyst particles. This can be achieved by the capture of metal ions with the two ligands of enhancing agent. Thus, compounds with similar bridging property (with two ligands) could be used as enhancing agents of the present invention. The enhancing agent is cataloged as two types: organic materials and inorganic salts. The organic materials are present in the form of formulas R—C—R', R—C=C—R', R—C=C—C=C—R' or R—C≡R'; wherein R and R'are sulfur, nitrogen, oxygen and phosphorus. Examples of the organic materials are azo compounds, azide compounds, thiourea, 4,4-dipyridyl, phenylenediamine, thiol aniline and 4-thiophenol.

The inorganic salts are metal halides, amine salts, sulfide and cyanide. Examples of the metal salts are sodium chloride, sodium bromide, sodium iodide, potassium iodide, $NH_4HF_2$, sodium cyanide, sodium thiocyanide.

The treatment conditions of enhancing are not critical. Preferably, the concentration of the enhancing agent varies from about 0.5 ppm to about 20 g/l, the treatment time varies from about 10 seconds to about 15 minutes, and the treatment temperature varies from about 15° C. to about 60° C.

5) Electroplating

The electroplating procedure is conventional. The part to be plated is used as a cathode in a conventional electroplating cell. Current density is conventional and varies typically within a range from about 5 through about 40 amps per $ft^2$.

The present invention will be described in further detail with reference to the following examples:

EXAMPLE 1

A FR-4™ type inner layer board is treated in a solution containing 18-amino-octadecylalkylsulfonic acid ($NH_3$—$C_{18}H_{36}$—$SO_3H$), and then immersed in a palladium chloride colloidal solution (containing 50–300 ppm of palladium). After being dipped and rinsed with water, the board is treated by dipping in a sodium hydroxide solution (0.5–10 wt %). Then, the board is connected in a cathode, and electroplated in a copper sulfate solution (containing 70 g/l copper sulfate and 100 ml/l sulfuric acid) for 10 minutes. The electroplating voltage is set at 5 V. After the electroplating, it can be found that only the area connected to the cathode can be electroplated, and the diameter of the electroplated area is not more than 0.5 mm, and the electroplated layer is present in a powder form.

EXAMPLE 2

The procedure of example 1 is repeated, but the board after the treatment by sodium hydroxide solution is further dipped in a sodium sulfide solution (0.05–20 g/l) for about 1 minute. After being dipped and rinsed with water, the board is electroplated with the conditions as indicated in example 1. The result shows that the electroplated copper extends laterally very fast at a rate of about 25 mm/min.

EXAMPLE 3

The procedure of example 2 is repeated, but replacing the sodium sulfide solution with a sodium cyanide solution (2 ppm to 40 ppm). The result shows that the lateral extension of copper deposition is about 15 mm/min.

EXAMPLE 4

The procedure of example 2 is repeated, but replacing the sodium sulfide solution with a sodium thiocyanide solution (5 ppm to 5 g/l). The result shows that the lateral extension of electroplated copper is about 30 mm/min.

EXAMPLE 5

The procedure of example 2 is repeated, but replacing the sodium sulfide solution with a thiourea solution (1 ppm to 500 ppm). The result shows that the lateral extension of the electroplated copper is about 20 mm/min.

EXAMPLE 6

The procedure of example 2 is repeated, but replacing the sodium sulfide solution with a potassium iodide solution (20 ppm to 20 g/l). The result shows that the lateral extension of the electroplated copper is about 5 mm/min.

EXAMPLE 7

The procedure of example 2 is repeated, but replacing the sodium sulfide solution with a 4,4-dipyridyl solution (1 ppm to 500 ppm). The result shows that the lateral extension of the electroplated copper is about 40 mm/min.

EXAMPLE 8

The procedure of example 2 is repeated, but replacing the sodium sulfide solution with a phenylenediamine solution (20 ppm to 1 g/l). The result shows that the lateral extension of the electroplated copper is about 20 mm/min.

EXAMPLE 9

The procedure of example 2 is repeated, but replacing the sodium sulfide solution with a thiol aniline solution (10 ppm to 5 g/l). The result shows that the lateral extension of the electroplated copper is about 25 mm/min.

EXAMPLE 10

The procedure of example 2 is repeated, but replacing the sodium sulfide solution with a 4-thiophenol solution (1 ppm to 500 ppm). The result shows that the lateral extension of the electroplated copper is about 40 mm/min.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed:

1. A process of direct plating onto a nonconductive substrate, comprising the steps of:
   1) modifying a surface of the nonconductive substrate with selected organic hydrocarbons or polymers to enhance its property of adsorbing catalysts to produce a conditioned substrate;
   2) immersing the conditioned substrate into a catalyst colloid-containing solution or a catalyst complex-containing solution to let the catalyst be adsorbed into the substrate;
   3) reducing the catalyst with a suitable acid or basic solution when a catalyst colloid-containing solution is used at step 2, or with a reducing agent when a catalyst complex-containing solution is used at step 2 to reduce the catalyst being adsorbed onto the substrate;
   4) immersing the substrate after the reducing step into an enhancing agent containing a nonsulfide compound with two ligands;
   5) proceeding with an electroplating process.

2. The process according to claim 1, wherein said non-conductive substrate is selected from the group comprising fire resistant glass-fiber laminates, fire resistant epoxy resin laminates and composite epoxy materials, polyimide, plastics, polyethylene and polytetrafluoroethylene.

3. The process according to claim 1, wherein the basic solution used in step 3) is selected from the group comprising ammonium hydroxide ($NH_4OH$), sodium hydroxide (NaOH), potassium hydroxide (KOH), sodium carbonate ($Na_2CO_3$), sodium hydrogen carbonate ($NaHCO_3$) and magnesium carbonate ($MgCO_3$), and wherein the acid solution is selected from the group comprising hydrofluoric acid (HF), fluoboric acid ($HBF_4$), sulfuric acid ($H_2SO_4$) and hydrochloric acid (HCl), and wherein the reducing agent is selected from the group comprising sodium borohydride ($NaBH_4$), dimethyl boron hydride, hydrazine, HCHO and phosphoric acid ($H_3PO_3$).

4. The process according to claim 3, wherein the concentration of the basic solution of step 3) is between 0.1 g/l and 120 g/l.

5. The process according to claim 1, wherein step 3) is carried out at a temperature between 20° C. to 70° C.

6. The process according to claim 1, wherein step 3) is carried out at a treatment time between 20 seconds to 10 minutes.

7. The process according to claim 1, wherein said enhancing agent of step 4) comprises organic materials or inorganic salts.

8. The process according to claim 7, wherein the organic materials are present in the form of formula A. R—CHX—CH=CH—$CH_2$—OH, R—CHX—CH=CH—$CH_2$—$NH_2$; B. R—CO—$CH_2$—$NH_2$, R—CO—$CH_2$—OH; or C. R—CHX—C≡C—$CH_2$—$NH_2$, R—CHX—C≡C—$CH_2$—OH, wherein R is alkyl or aromatic groups, and X is nitrogen-containing or oxygen-containing functional groups selected from the groups comprising amino, alkanol and ether.

9. The process according to claim 7, wherein said organic materials are azo compounds or azide compounds.

10. The process according to claim 7, wherein said organic materials are, 4,4-dipyridyl or phenylenediamine.

11. The process according to claim 7, wherein the inorganic salts are metal halides, amine salts, and cyanide salts.

12. The process according to claim 11, wherein the inorganic salts are sodium chloride, sodium bromide, sodium iodide, potassium iodide, $NH_4HF_2$, and sodium cyanide.

13. The process according to claim 7, wherein the enhancing agent of step 4) has a concentration between 0.5 ppm and 20 g/l.

14. The process according to claim 1, wherein is carried out at a treatment time between 10 seconds and 15 minutes, and a treatment temperature range of step 4) is between 15° C. and 60° C.

15. The process according to claim 1, wherein the electroplating process of step 5) is a conventional process.

* * * * *

UNITED STATES PATENT AND TRADEMARK OFFICE
CERTIFICATE OF CORRECTION

PATENT NO : 5,762,777
DATED : June 9, 1998
INVENTOR(S): YANG, et al.

It is certified that error appears in the above-identified patent and that said Letters Patent is hereby corrected as shown below:

Amend the cover page of the patent to include under the Section References Cited:

"FOREIGN PATENT DOCUMENTS 388,286    10/89    EP"

In column 4, line 9, delete "hydofluoric" and substitute therefore -- hydrofluoric --.

In claim 14, line 1, include -- step 4) -- after "wherein"

Signed and Sealed this

Twelfth Day of September, 2000

Attest:

Q. TODD DICKINSON

*Attesting Officer*    *Director of Patents and Trademarks*